United States Patent [19]

Yamada et al.

[11] Patent Number: 4,681,421
[45] Date of Patent: Jul. 21, 1987

[54] DOUBLE-FACE FLEXIBLE PRINTED CIRCUIT BOARD

[75] Inventors: Akira Yamada, Tokyo; Go Tokura, Kanagawa, both of Japan

[73] Assignee: Canon Kabushiki Kaisha, Tokyo, Japan

[21] Appl. No.: 839,801

[22] Filed: Mar. 12, 1986

Related U.S. Application Data

[63] Continuation of Ser. No. 656,172, Sep. 28, 1984, abandoned.

[30] Foreign Application Priority Data

Oct. 6, 1983 [JP] Japan ............................ 58-187271

[51] Int. Cl.⁴ .................................................. G03B 7/00
[52] U.S. Cl. .................................... 354/485; 354/288; 324/73 PC
[58] Field of Search ....................... 354/485, 219, 288; 324/73 PC

[56] References Cited

U.S. PATENT DOCUMENTS

| | | | |
|---|---|---|---|
| 3,830,956 | 8/1974 | Wootton et al. | 324/73 PC |
| 3,846,805 | 11/1974 | Kiyonara et al. | 354/288 |
| 4,359,277 | 11/1982 | Shimizu et al. | 354/485 |

OTHER PUBLICATIONS

"Flexible Circuits Bend to Designers' Will", Electronics, Sep. 15, 1977, pp. 97–105.

*Primary Examiner*—Russell E. Adams
*Attorney, Agent, or Firm*—Toren, McGeady & Associates

[57] ABSTRACT

The disclosed double-face flexible printed circuit board arranged in a precision apparatus such as a camera has a circuit pattern to electrically check the electrical circuit elements mounted thereon. The electrical check circuit pattern is disposed on one side of the board. The electrical circuit elements are mounted in flat package state on the side of the board opposite the side having the electrical check circuit pattern.

11 Claims, 6 Drawing Figures

DOUBLE-FACE FLEXIBLE PRINTED CIRCUIT BOARD

This is a continuation of application Ser. No. 656,172, filed Sept. 28, 1984, now abandoned.

BACKGROUND OF THE INVENTION

1. Field of the Invention

This invention relates to a printed circuit board and more particularly to a double-face flexible printed circuit board for use in a compact apparatus such as a camera or the like having an extremely limited space for arranging electrical circuit elements.

2. Description of the Prior Art

It has recently become general practice to have electrical circuit elements densely arranged within precision apparatus or equipment such as cameras or the like. The electrical circuit arrangement has tended to increase in scale and complexity. Meanwhile, these types of apparatus tend to have more compact bodies and more complex and diversified devices packed within their compact bodies. This tendency often results in an extremely limited space for electrical circuit elements. To cope with this, it is common practice to have the majority of electrical circuit elements integrated or assembled on a flexible printed circuit board and to place the assembled flexible board in a narrow clearance that remains between an internal mechanism and covering of the apparatus. This takes advantage of the flexibility of the printed circuit board.

The electrical circuit elements generally include some type of control circuit elements such as a central processing unit (hereinafter referred to as CPU) for the purpose of electrically controlling various devices included in the apparatus. It is considered necessary to perform an electrical check on these elements after they are soldered to the printed circuit board or to mount an electrical element for adjusting the value of input information. Generally, for the electrical check of a CPU mounted on a flexible circuit board, a lead frame wiring pattern is arranged on the circuit board and the electrical check is accomplished by bringing a probe pin into contact with the wiring pattern. However, the flexible printed circuit board is not as strong as it is flexible. Therefore, direct probing might break or damage the wiring pattern or the circuit board disposed in the clearance between internal mechanisms. To prevent this, various solutions have been employed. One solution involves reinforcing the circuit board by attaching a hard lining plate made, for example, of glass-epoxy resin or paper-phenol resin, to the reverse side of the pattern where the probing pin comes into contact. Another solution involves arranging the checking pattern in a roundabout way to touch the flat surface of a member of the apparatus such as a casing or base plate.

However, the method of attaching the reinforcement lining plate to the flexible circuit board increases the number of parts as well as the number of manufacturing processes and thus results in an increase in cost. Further, the other roundabout arrangement to extend the checking pattern to a flat surface member decreases the available area for the arrangement of parts. This method not only prevents the desired dense arrangement of the parts but also results in an increased size for the flexible circuit board.

This will be more clearly understood from the following description with reference to FIGS. 5 and 6 of the accompanying drawings. FIG. 5 shows in a sectional view an example of the conventional printed circuit board mounting arrangement within a single-lens reflex camera. FIG. 6 is a development view of the printed circuit board. Reference numeral 1 denotes a double-face flexible printed circuit board; numeral 2 denotes a CPU provided with a control circuit constructed of a molded electrical circuit element of the known flat package type. CPU 2 is arranged to perform varied kinds of functions. Electrical check patterns 3 and 3' are drawn from the lead frame of the CPU 2 and are arranged to permit an electrical check after the CPU 2 is mounted on the flexible printed circuit board 1. The electrical check patterns 3 and 3' include patterns $3a$–$3h$ respectively electrically connected to the lead frames $2a$–$2h$ of the CPU 2. The flexible printed circuit board 1 is provided with a reinforcement lining plate 4. Further, the double-face flexible printed circuit board 1 is secured to a camera body 5 by a screw 7 through a mounting screw hole 6. A substrate 8 is arranged for receiving film sensitivity information and is connected by soldering via holes 9 to the double-face flexible board 1. The substrate 8 is mounted on a base plate 10 arranged to carry a film rewinding fork. The camera is provided with an upper cover 11 and a pentagonal roof type prism 12. In carrying out an electrical check on the CPU 2 after mounting it on the flexible board 1, a probing pin 13 is brought into electrical contact with the electrical check patterns 3 and 3' arranged from the lead frames $2a$–$2h$ on the flexible board 1. The electrical check is performed as a final check for the camera before the upper cover is mounted.

In a compact precision apparatus like a camera, however, a flexible printed circuit board is generally disposed within a clearance between an internal mechanism and a covering of the apparatus, such as a clearance which remains between the upper cover 11 and the pentagonal prism 12. Such being the location of the flexible board 1, the flexible board 1 tends to become damaged or broken by the probing pin 13 when the pin 13 is brought into contact with the electrical check patterns.

To prevent such damage, a hard lining plate 4 made of glass-epoxy resin or paper-phenol resin is applied to one side of the flexible board opposite to the side on which the electrical check patterns are arranged, as shown in FIG. 5. In another solution the above-stated problem, wiring for the electrical check patterns 3, is extended to a flat surface of a member disposed within the camera body 5. The conventional arrangement applying the reinforcement plate 4 to the flexible printed circuit board 1 results in an increased cost as it necessitates an additional manufacturing process. An arrangement to extend the wiring of the electrical check patterns 3 to an area such as that indicated by the numeral 14 in FIG. 6 also results in an increased cost because it increases the size of the flexible board 1 and substantially decreases the density of the circuit arrangement.

In a camera provided with an electronic circuit arrangement for controlling various devices, the elements which supply input information to a control circuit include electrical circuit adjustment elements such as selective resistors to be used by selecting the resistance values thereof after the optimum resistance value for the circuit has been measured. These adjustment elements and fixed electrical circuit elements which have preset electrical values and require no adjustment, such as fixed resistors, fixed capacitors, semiconductor elements, etc., are densely mixed on a narrow printed circuit board. Therefore, in carrying out adjustment work on an assembly line, work efficiency has been low as one element tends to be mistaken for another. Further, this has necessitated some additional processes such as an arrangment to attach identification marks to the elements to be adjusted.

SUMMARY OF THE INVENTION

It is a first object of this invention to provide a double-face flexible printed circuit board which permits dense circuit element packaging at a low cost and is highly suited for compact precision apparatus.

It is a second object of the invention to provide a double-face flexible printed circuit board which enables adjustment work to be carried out efficiently on electrical circuit elements.

These and further objects and features of the invention will become apparent from the following detailed description thereof taken in conjunction with the accompanying drawings.

DETAILED DESCRIPTION OF THE PREFERRED EMBODIMENTS

The following describes some preferred embodiments of the present invention with reference to the accompanying drawings.

Figure 1:
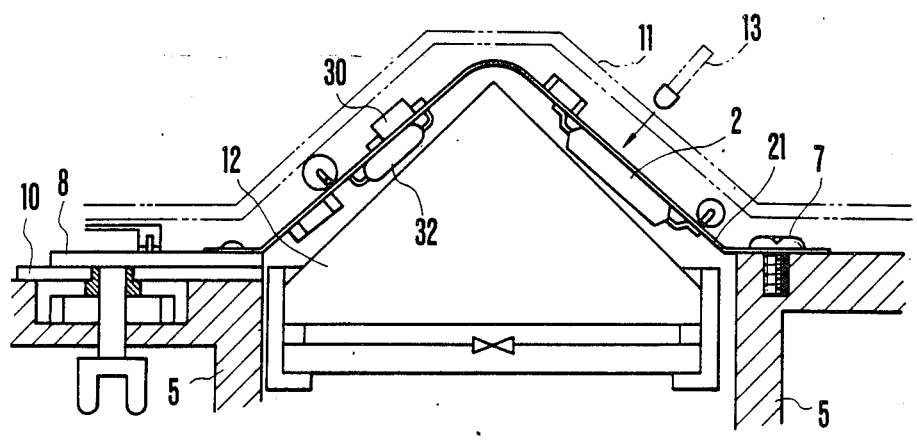
FIG. 1 is a sectional view showing a double-face flexible printed circuit board arranged as an embodiment of the invention and mounted on a single-lens reflex camera.
Figure 2:
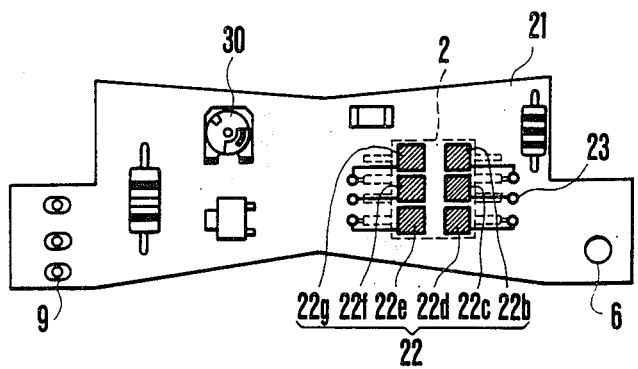
FIG. 2 is a development view of the double-face flexible printed circuit board of FIG. 1.
Figure 5:
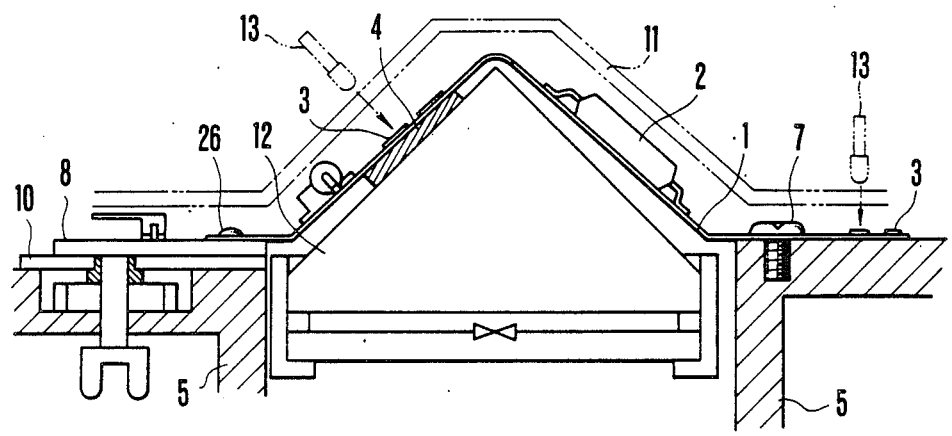
FIG. 5 is a sectional view showing by way of example a conventional flexible printed circuit board mounted on a single-lens reflex camera.
Figure 6:
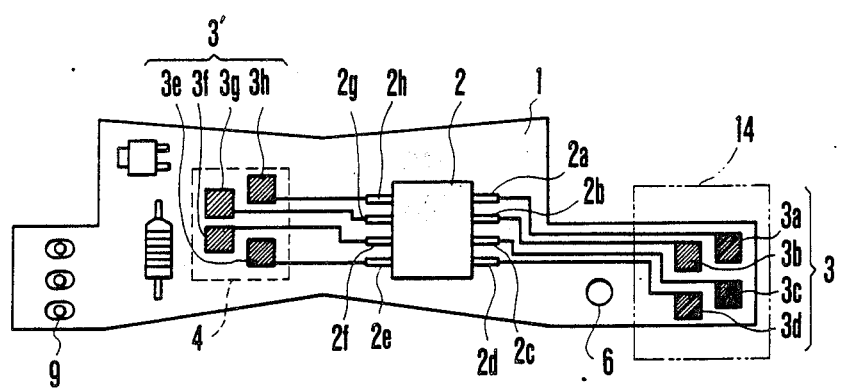
FIG. 6 is a development view of the conventional flexible board of FIG. 5.

FIGS. 1 and 2 show a double-face flexible printed circuit board as an embodiment of the invention and applied to a single-lens reflex camera. In these drawings, the same parts as those of the conventional printed circuit board shown in FIGS. 5 and 6 and previously described are indicated by the same reference numerals. Reference numeral 21 denotes a double-face flexible printed circuit board 21 arranged according to the invention. A plurality of pad areas 22b to 22g of a checking circuit pattern 22 are arranged on the board 21 for the same purpose as that of the patterns 3 and 3' of FIG. 5. These pad areas are disposed on one side of the board 21 opposite to the side on which a CPU 2 of the molded flat package type is mounted, with their backs to the back of the CPU 2 through the board 21. A hole pattern 23 is arranged to be electrically conductive for patterns provided on both sides of the flexible printed circuit board 21. A semi-fixed resistor 30 is arranged as a circuit element for adjustment and is disposed on the same side of the board as the electrical checking pattern 22. A fixed resistor 32 is an electrical circuit element requiring no adjustment. As mentioned above, the molded package type CPU 2 is mounted in the same position as, but on the opposite side of the board 21; that is, opposite the side having the pad areas provided for the purpose of probing the double-face flexible printed circuit board 21. The part of the board where the pad areas are arranged for an electrical check to be performed on the flexible circuit board, is thus reinforced by utilizing the flatness of the flat package type CPU. With the printed circuit board arranged in this manner, the additional reinforcement member used in the conventional arrangement for a part with which the probing pin 13 comes into contact is no longer necessary. Further, since the CPU 2 and the pad areas are located in the same place, wiring for the pad areas can be shortened to a great degree, so that the packaging density of the electrical circuit elements on both sides of the circuit board can be increased without increasing the shape and size of the flexible printed circuit board.

Further, in this embodiment, all the circuit adjustment elements that are adjustable on the electrical circuit, such as the fixed resistor 30, are arranged on a side more readily adjustable, i.e., on the surface facing the upper cover of the camera. This arrangement facilitates adjustment work to be carried out on them and thus enhances the work efficiency of the assembly line. Besides, adjustment after completion of assembly and/or replacement of parts with other parts can be accomplished simply by removing the upper cover of the camera.

Figure 3:
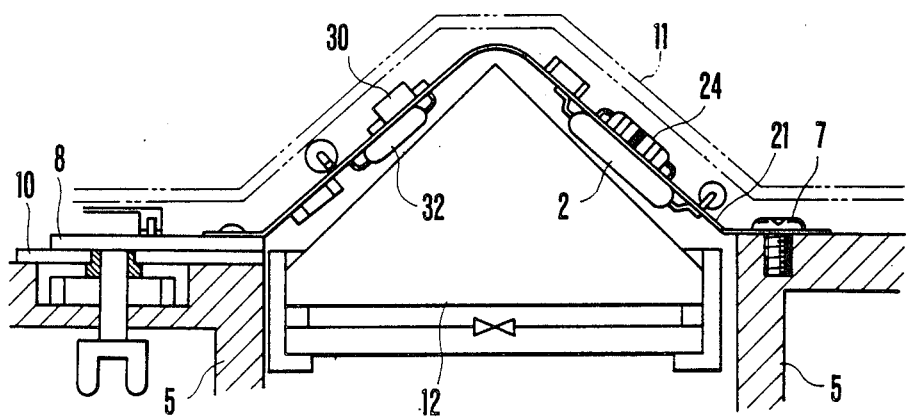
FIG. 3 is a sectional view showing a double-face flexible printed circuit board arranged as another embodiment of the invention and mounted on a single-lens reflex camera.
Figure 4:
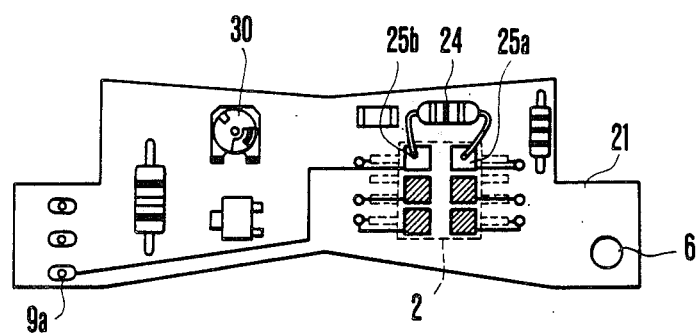
FIG. 4 is a development view of the double-face flexible printed circuit board of FIG. 3.

FIGS. 3 and 4 show, in a sectional view and development view, a printed circuit board arranged as another embodiment of the invention and as applied to a single-lens reflex camera. The same reference numerals as those used in FIGS. 1 and 2 indicate the same parts. As previously mentioned, a CPU having a control circuit capable of controlling varied functions is used nowadays for a precision apparatus such as a camera. The information inputs of the CPU include some input that calls for an electrical circuit element to adjust an information value after the internal devices have been assembled and before a covering is mounted thereon. In the embodiment shown in FIGS. 3 and 4, a pattern required for mounting the above-stated electrical circuit adjustment element is disposed on one side of the printed circuit board opposite to the side on which the CPU 2 is mounted and is located in the same place as the CPU 2. Reference numeral 24 denotes the electrical circuit adjustment element. Numerals 25a and 25b denote fixed areas for mounting this element 24. The fixed area 25a is electrically connected to the lead frame 2a of the CPU 2. The fixed area 25b is electrically connected via holes 9a of the flexible board 21 to one end of an information pattern (not shown) of the substrate 8 provided for receiving information on film sensitivity. Adjustment is carried out in the following manner: After the double-face flexible printed circuit board 21 is mounted on the camera body 5 and the film sensitivity information input substrate 8 in the same manner as the embodiment shown in FIG. 1, the fixed areas 25a and 25b are subjected to probing to check them for the optimum resistance value. Then, a fixed resistance 24 having this value is soldered to the fixed areas 25a and 25b. Following that, the upper cover 11 is mounted on the camera body.

Use of the double-face flexible printed circuit board arranged as shown in FIGS. 3 and 4 gives the following advantages in addition to the advantageous effect as mentioned in the foregoing description given with reference to FIGS. 1 and 2: Since the flexible board is reinforced by the flat packaged shape of the CPU 2, the electrical circuit adjustment element 24 is mounted easily. Further, since the patterns on which the adjustment element 24 is mounted by soldering are separated from the lead frame soldering part of the CPU 2, the element 24 can be soldered without melting the solder of the lead frame.

As described in the foregoing, the double-face flexible printed circuit board according to this invention is reinforced by the flat packaged shape of the electrical circuit element. This dispenses with the reinforcement member which has been necessary for reinforcement of the check pattern part arranged to have a probing pin come into contact therewith. The invented arrangement not only reduces the number of manufacturing processes but also permits reduction in cost of the flexible printed circuit board. Further, since the wiring for the check pattern is shortened to a great degree, the packaging density on the flexible printed circuit board is greatly enhanced for the advantageous use of the flexible printed circuit board, which is expensive.

As previously described, in the double-face flexible printed circuit board according to the invention, all of the circuit adjustment elements that are adjustable on the electrical circuit are mounted on the outer side of the double-face flexible circuit board after the circuit board has been mounted. This arrangement enhances the efficiency of the adjustment work carried out on an assembly line and also facilitates adjustment work performed after assembly work as it can be carried out by just removing a cover member of the apparatus.

Further, the double-face flexible printed circuit board according to the invention is arranged to be reinforced by the flat packaged shape of an electrical circuit element. This arrangement also facilitates mounting work in mounting an electrical circuit adjustment element on the opposite side of the flexible printed circuit board.

What is claimed is:

1. A double-face flexible printed circuit board to be placed within a space between an internal mechanism and an outer cover of a camera, comprising:
   one side of said printed circuit board having an electrical circuit element of a flat packaged shape disposed therein on a given area; and
   another side of said printed circuit board, opposite to said one side, having a pad area of a checking circuit pattern arranged thereon directly opposite the given area.

2. A printed circuit board according to claim 1, wherein said side on which said pad area is arranged faces said outer cover.

3. A printed circuit board according to claim 1, wherein a CPU (central processing unit) is employed as said electrical circuit element.

4. A printed circuit board according to claim 1, wherein said camera is a single-lens reflex camera.

5. A printed circuit board according to claim 4, wherein said double-face flexible printed circuit board is disposed within a space between a pentagonal prism and the outer cover of the camera.

6. A double-face flexible printed circuit board to be placed within a camera, comprising:
   one side of said circuit board having an electrical circuit of a flat packaged shape mounted thereon on a given area; and
   another side of said circuit board, opposite to said one side, having a fixed area of a circuit pattern for mounting a circuit adjusting element, said fixed area arranged thereon directly opposite the given area.

7. A printed circuit board according to claim 6, wherein said double-face flexible printed circuit board is disposed within a space between an internal mechanism and an outer cover of said camera.

8. A printed circuit board according to claim 7, wherein said another side of the printed circuit board for mounting said circuit elements for adjustment is arranged to face said outer cover of the camera.

9. A printed circuit board according to claim 7, wherein said camera is a single-lens reflex camera.

10. A printed circuit board according to claim 9, wherein said double-face flexible printed circuit board is disposed within a space between a pentagonal prism and said outer cover.

11. A circuit adjustment method for a camera having a double-face flexible printed circuit board on which an electrical circuit is formed by a plurality of first electrical circuit elements, comprising mounting a flat packaged electrical circuit element on one side of the printed circuit board; forming a fixed area of a circuit pattern on another side of the printed circuit board opposite to said one side; and mounting additional circuit elements for adjustment of the electrical circuit of the printed circuit board on said fixed area of said circuit pattern directly opposite the flat packaged electrical circuit element.

* * * * *